United States Patent [19]

Takada

[11] 4,259,599

[45] Mar. 31, 1981

[54] COMPLEMENTARY TRANSISTOR SWITCHING CIRCUIT

[75] Inventor: Shigeho Takada, Oita, Japan

[73] Assignee: Tokyo Shibaura Denki Kabushiki Kaisha, Japan

[21] Appl. No.: 10,041

[22] Filed: Feb. 6, 1979

[30] Foreign Application Priority Data

Mar. 8, 1978 [JP] Japan ................................. 53-26392

[51] Int. Cl.³ ........................ H03K 17/60; H03K 3/01
[52] U.S. Cl. .................... 307/255; 307/268; 307/270; 307/540; 330/263
[58] Field of Search ................ 307/255, 268, 54, 270, 307/237, 296 R; 330/263

[56] References Cited

U.S. PATENT DOCUMENTS

| 2,791,645 | 5/1957 | Bessey | 330/263 |
| 3,171,984 | 3/1965 | Eshelman et al. | 307/255 |
| 3,526,845 | 9/1970 | Sikorra | 330/263 |
| 3,739,292 | 6/1973 | Furahashi | 330/263 |

Primary Examiner—Stanley D. Miller, Jr.
Assistant Examiner—B. P. Davis
Attorney, Agent, or Firm—Finnegan, Henderson, Farabow, Garrett and Dunner

[57] ABSTRACT

A switching circuit having two complementary transistors of collector coupling type, a drive transistor, a current backflow-preventing diode and a level-shifting power source. When the drive transistor is on, one complementary transistor is turned off by the level-shifting power source. When the drive transistor is off, the other complementary transistor is turned off by the current backflow-preventing diode. It is sufficient that the drive transistor can switch a current which corresponds to the sum of the base currents of the complementary transistors.

6 Claims, 5 Drawing Figures

COMPLEMENTARY TRANSISTOR SWITCHING CIRCUIT

BACKGROUND OF THE INVENTION

This invention relates to a switching circuit having an output circuit which is constituted by complementary transistors.

Hitherto used are switching circuits such as AND gates, digital circuits and pulse circuits, each having a complementary transistor circuit at the output stage. Two types of such complementary circuits are known. In one of the types, output signals are delivered from the emitters of complementary transistors. In the other type, output signals are delivered from the collectors of complementary transistors. The complementary circuits of the latter type are more often used because they use the power source voltage more effectively than the circuits of the former type.

Now referring to FIG. 1 a switching circuit having a typical complementary circuit of the latter type will be described. When an NPN transistor $Q_1$ is off, a base current is supplied to another NPN transistor $Q_2$ from a power source $+V_{CC}$ through serially connected resistors 2 and 3, thereby to turn on the NPN transistor $Q_2$. It is necessary to prevent the base current of a PNP transistor $Q_3$ from flowing through a resistor 4. To achieve this, the resistance of the resistor 2 should be made much lower than that of either resistors 3 or 4. When the NPN transistor $Q_1$ is on, the transistor $Q_2$ is off, and the transistor $Q_3$ is turned on by the base current flowing through the resistor 4. While the transistor $Q_1$ remains on, the resistance of the resistor 2 is so small that more and more current flows through the transistor $Q_1$.

That is, the transistor $Q_1$ consumes much power, and a large collector current should therefore be supplied to the transistor $Q_1$. Generally, a larger collector current type transistor requires, the more chip area it should have. As a result, a transistor which needs a large collector current is very costly. This would be undesirable particularly when the switching circuit of FIG. 1 is redesigned into an IC.

SUMMARY OF THE INVENTION

An object of this invention is to provide a switching circuit which consumes little power and which uses the power effectively.

To achieve the object, a switching circuit according to this invention comprises a first transistor the base of which is supplied with an input signal and the emitter of which is connected to a first power source; a second transistor the emitter of which is connected to the first power source and the conductivity type of which is the same as that of the first transistor; a third transistor the emitter and collector of which are connected to a second power source and the collector of the second transistor, respectively and the conductivity type of which is opposite to that of the second transistor, the collectors of said second and third transistors delivering an output signal; current control means connected between the collector of the first transistor and the base of the third transistor for controlling a first base current of the third transistor; current supply means for supplying a second base current to the second transistor, said current supply means being connected at one end to the second power source and at the other end to the base of the second transistor; and current backflow-preventing means connected between the collector of the first transistor and said other end of the current supply means for preventing the first base current from flowing while said first transistor remains off.

The switching circuit of the above-mentioned construction consumes little power and can utilize the power source voltage every effectively. Thus the switching circuit reduces power loss. Further, in case the switching circuit is redesigned into an IC, the IC chip size can be reduced in size.

DESCRIPTION OF THE PREFERRED EMBODIMENTS

Now referring to FIGS. 2 to 5, the preferred embodiments of the switching circuit according to this invention will be described. To avoid repeated descriptions, the same or similar parts of the embodiments will be denoted by the same or like numerals and symbols in FIGS. 2 to 5.

Figure 1:
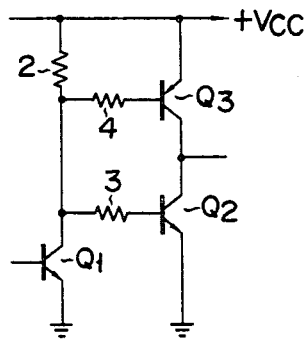
FIG. 1 shows a prior art switching circuit.
Figure 2:
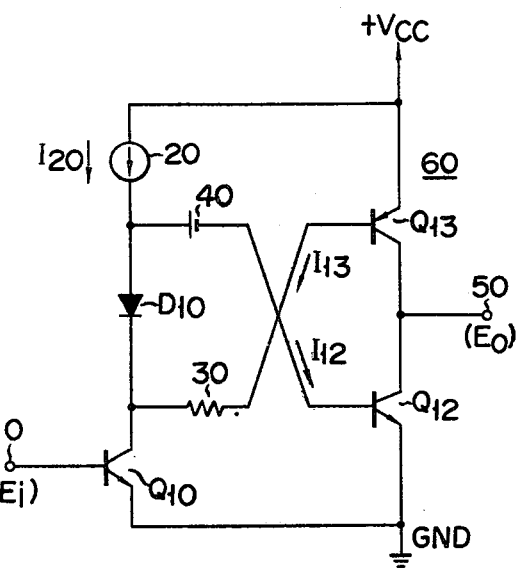
FIG. 2 shows the fundamental structure of a switching circuit according to this invention.

As shown in FIG. 2, a switching circuit according to this invention comprises an NPN transistor $Q_{10}$ with a base connected to an input terminal 10, which is supplied with an input signal $E_i$. The emitter of the transistor $Q_{10}$ is connected to ground, and the collector thereof to the cathode of a diode $D_{10}$ for preventing a current backflow. The anode of the diode $D_{10}$ is connected to a positive power source $+V_{CC}$ through a current source 20. It is also connected to the base of an NPN transistor $Q_{12}$ through a level-shifting voltage source 40. The emitter of the transistor $Q_{12}$ is connected to the ground, and the collector thereof to collector of a PNP transistor $Q_{13}$. The emitter of the transistor $Q_{13}$ is connected to the positive power source $+V_{CC}$, and the base thereof to the collector of the transistor $Q_{10}$ through a resistor 30. The collectors of the transistors $Q_{12}$ and $Q_{13}$ are connected to an output terminal 50, from which an output signal $E_o$ is delivered.

The transistors $Q_{12}$ and $Q_{13}$ constitute an inverter circuit 60 of complementary type. The transistor $Q_{10}$ constitutes an inverter circuit for driving the inverter circuit 60. Thus, at the terminals 10 and 50 there appear signals of the same phase.

The switching circuit as illustrated in FIG. 2 operates in the following manner. In the following description, "$V_{BE}$" and "$V_{CE(SAT)}$" will denote the base-emitter threshold voltage of the transistors $Q_{10}$, $Q_{12}$ and $Q_{13}$ and the saturated collector-emitter voltage of these transistors, which is substantially zero, respectively. "$V_F$" will denote the voltage drop of the diode $D_{10}$ in forward direction and also the electromotive voltage of the voltage source 40. Here it is assumed that the current source 20 can supply current $I_{20}$ large enough to turn on the transistor $Q_{12}$.

If the input voltage $E_i$ is lower than $V_{BE}$, the transistor $Q_{10}$ is turned off. Then, all the current $I_{20}$ from the current source 20 flows to the base of the transistor $Q_{12}$. The current is denoted by $I_{12}$ in FIG. 2. So long as the transistor $Q_{10}$ remains off, no base current $I_{13}$ flows from the transistor $Q_{13}$. This is because the base current $I_{13}$ flows in such a direction as to apply a backward bias on the diode $D_{10}$. As a result, the transistor $Q_{12}$ is turned on, while the transistor $Q_{13}$ is turned off. At this time, the output voltage $E_o$ at the output terminal 50 is equal to $V_{CE(SAT)}$ and is substantially zero.

On the other hand, if the input voltage $E_i$ is higher than $V_{BE}$, the transistor $Q_{10}$ is turned on. Then, all the current $I_{20}$ flows to the collector of the transistor $Q_{10}$. At this moment, the anode potential $V_F+V_{CE(SAT)}$ of the diode $D_{10}$ is substantially equal to $V_F$. The base potential of the transistor $Q_{12}$ has its level shifted by $-V_F$ by the voltage source 40, it is substantially zero. That is, the transistor $Q_{12}$ is turned off. While the transistor $Q_{10}$ is on, the base current $I_{13}$ flows to the base of the transistor $Q_{13}$. Thus, the transistor $Q_{10}$ is supplied with current $I_{20}+I_{13}$ so long as it remains on. In this case, the output voltage $E_o$ delivered by the output terminal 50 is: $V_{CC}-V_{CE(SAT)} \simeq V_{CC}$ While the transistor $Q_{10}$ is on, the collector current of the transistor $Q_{10}$ is $I_{20}+I_{13}$ at most. Suppose the current amplification factor $h_{FE}$ of the transistors $Q_{12}$ and $Q_{13}$ is 100 and that the peak current value of a load connected to the output terminal 50 is 10 mA. Then, the peak values of the base currents $I_{12}$ and $I_{13}$ are 0.1 mA. Current $I_{20}$ should be large enough to turn on the transistor $Q_{12}$. Thus it is sufficient that current $I_{20}$ is 0.1 mA at least. Suppose current $I_{20}$ is 0.2 mA, 0.1 mA larger than necessary. Then the sum of $I_{20}$ and $I_{13}$ becomes 0.3 mA. If the signal supplied to the input terminal 10 is a 50%-duty rectangular wave signal, the collector current of the transistor $Q_{10}$ becomes no more than 0.15 mA on average. In this case the output voltage $E_o$ at the output terminal 50 becomes almost equal to the voltage value of $V_{CC}$, peak to peak. This means that the power source voltage $V_{CC}$ has been used substantially 100%.

For the reason mentioned above, the transistor $Q_{10}$ can be extremely small. This reduces not only power consumption but semiconductor chip size. To put it more precisely, since the transistor $Q_{10}$ can be operated by a small current, it is easy to enhance the input impedance at the input terminal 10. If the switching circuit shown in FIG. 2 is used to constitute an AND gate, for example, the AND gate can have a large input impedance. Such AND gate can therefore be connected directly to a C-MOS IC with a small output current capacity.

Now referring to FIG. 3, another switching circuit according to the invention will be described. This circuit is identical with the circuit of FIG. 2, except that a resistor $20_1$ and a level-shifting diode $D_{40}$ are used in place of the current source 20 and the level-shifting voltage source 40, respectively. The resistance of the resistor $20_1$ is of such value that a transistor $Q_{12}$ is fully turned on when a transistor $Q_{10}$ is turned off. For example, if base current $I_{12}$ is 0.1 mA when the transistor $Q_{12}$ is turned on, the forward voltage drop $V_F$ of the diode $D_{40}$ is 0.6 V, the threshold voltage $V_{BE}$ of the transistor $Q_{12}$ is 0.6 V and the power source voltage $+V_{CC}$ is 5.0 V, then the resistance of the resistor $20_1$ should be 38 K$\Omega$ [$=(5.0-0.6\times2)/0.1$] or a little less.

Figure 3:
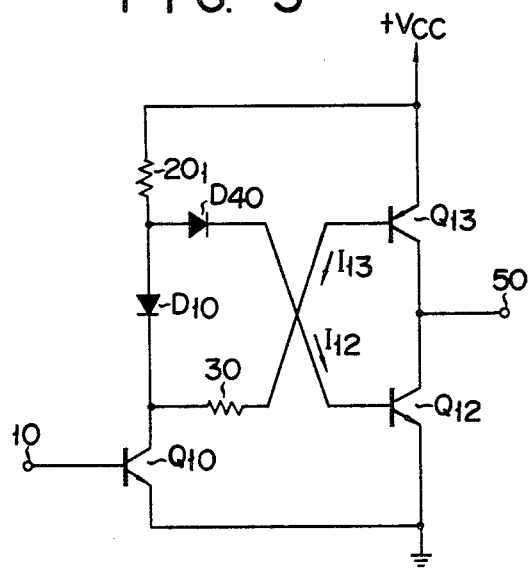
FIG. 3 is a circuit diagram illustrating in detail the structure of a circuit similar to the switching circuit shown in FIG. 2.
Figure 4:
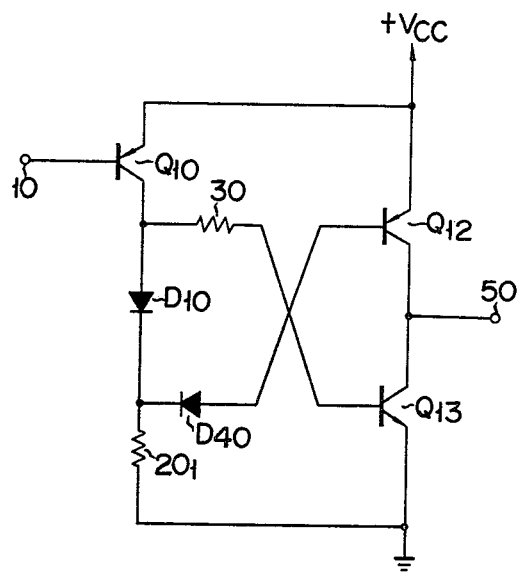
FIG. 4 shows a modification of the circuit structure shown in FIG. 3.

If the transistors $Q_{10}$ to $Q_{13}$ of the circuit shown in FIG. 3 are replaced by transistors of the opposite conductivity type, the circuit will have such a structure as illustrated in FIG. 4.

Figure 5:
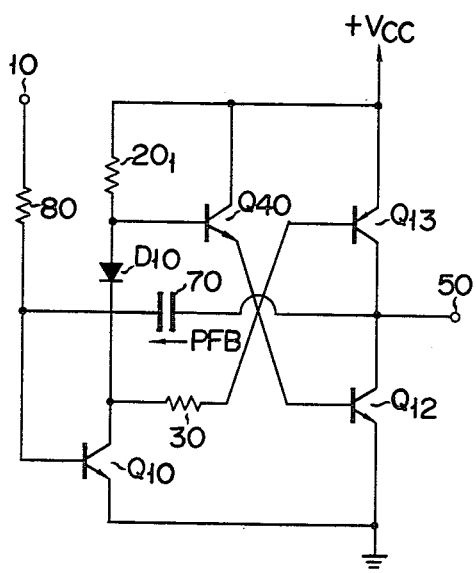
FIG. 5 illustrates another modification of the circuit structure shown in FIG. 3.

As shown in FIG. 5, the level-shifting diode $D_{40}$ of the circuit shown in FIG. 3 may be replaced by an NPN transistor $Q_{40}$, and the circuit may be provided with a PN junction capacitor 70 to achieve positive feedback. The capacitor 70 is connected between the collector of a transistor $Q_{12}$ and the base of a transistor $Q_{10}$ so as to elevate the switching speed. The base of the transistor $Q_{10}$ is connected to an input terminal 10 via a resistor 80. The capacitor 70 and the resistor 80 constitute a positive feedback path. The NPN transistor $Q_{40}$ acts as an emitter follower, and its threshold voltage $V_{BE}$ serves to shift the base potential of the transistor $Q_{12}$. Since the transistor $Q_{12}$ and the transistor $Q_{40}$ constitute a Darlington circuit, the base current of the transistor $Q_{40}$ can be extremely small. Then, the collector current of the transistor $Q_{10}$ can be made smaller than in the switching circuit illustrated in FIG. 3.

Although a few specific circuits have been illustrated and described herein, it is not intended that the invention be limited to the elements and the circuit arrangements disclosed. One skilled in the art will recognize the particular elements or subcircuits may be changed without departure from the spirit of the invention.

What is claimed is:

1. A switching circuit comprising:
   a first transistor the base of which is supplied with an input signal from an input terminal of said switching circuit and the emitter of which is connected to a first power source;
   a second transistor the emitter of which is connected to the first power source and the conductivity type of which is the same as that of the first transistor;
   a third transistor the emitter and collector of which are connected respectively to a second power source and the collector of the second transistor and the conductivity type of which is opposite to that of the second transistor, the commonly connected collectors of said second and third transistors constituting an output terminal of said switching circuit;
   current control means connected between the collector of the first transistor and the base of the third transistor for controlling a first base current of the third transistor;
   current supply means for supplying a second base current to the second transistor, said current supply means being connected at a first end to the second power source and at a second end to the base of the second transistor;
   current backflow-preventing means connected between the collector of the first transistor and said other end of the current supply means for preventing the first base current from flowing while said first transistor remains off; and
   positive feedback means connected between said input and output terminals for elevating a switching speed of the switching circuit.

2. A switching circuit according to claim 1, further comprising a potential-shifting means provided between the base of said second transistor and said second end of said current supply means for reducing the base-emitter potential difference of said second transistor to the threshold voltage thereof or less while said first transistor remains on.

3. A switching circuit according to claim 1, wherein said current supply means is constituted by a resistor.

4. A switching circuit according to claim 1, wherein said current backflow-preventing means is constituted by a diode.

5. A switching circuit according to claim 2, wherein said potential-shifting means is constituted by a diode, the forward voltage drop of which is utilized to reduce the base-emitter potential difference of said second transistor.

6. A switching circuit comprising:
   a first transistor the base of which is supplied with an input signal and the emitter of which is connected to a first power source;
   a second transistor the emitter of which is connected to the first power source and the conductivity type of which is the same as that of the first transistor;
   a third transistor the emitter and collector of which are connected respectively to a second power source and the collector of the second transistor and the conductivity type of which is opposite to that of the second transistor, the commonly connected collectors of said second and third transistors constituting an output terminal for said switching circuit;
   current control means connected between the collector of the first transistor and the base of the third transistor for controlling a first base current of the third transistor;
   current supply means for supplying a second base current to the second transistor, said current supply means being connected at a first end to the second power source and at the second end to the base of the second transistor;
   current backflow-preventing means connected between the collector of the first transistor and said second end of the current supply means for preventing the first base current from flowing while said first transistor remains off; and
   a potential-shifting means provided between the base of said second transistor and said second end of said current supply means for reducing the base-emitter potential difference of said second transistor to the threshold voltage thereof or less while said first transistor remains on; wherein said potential-shifting means is constituted by a transistor, the base-emitter threshold voltage of which is utilized to reduce the base-emitter potential difference of said second transistor.

* * * * *